United States Patent
Callanan

(10) Patent No.: US 10,359,449 B2
(45) Date of Patent: Jul. 23, 2019

(54) CURRENT MEASUREMENT TECHNIQUES TO COMPENSATE FOR SHUNT DRIFT

(71) Applicant: Analog Devices Global, Hamilton (BM)

(72) Inventor: Andreas Callanan, Murroe (IE)

(73) Assignee: Analog Devices Global, Hamilton (BM)

( * ) Notice: Subject to any disclaimer, the term of this patent is extended or adjusted under 35 U.S.C. 154(b) by 198 days.

(21) Appl. No.: 15/472,706

(22) Filed: Mar. 29, 2017

(65) Prior Publication Data

US 2018/0284159 A1 Oct. 4, 2018

(51) Int. Cl.
*G01R 15/14* (2006.01)
*G01R 19/25* (2006.01)

(52) U.S. Cl.
CPC ....... *G01R 15/146* (2013.01); *G01R 19/2506* (2013.01)

(58) Field of Classification Search
CPC .. G01R 1/203; G01R 15/146; G01R 19/0007; G01R 31/26; G01R 31/2642; G01R 31/2648; G01R 31/2831; G01R 31/31702; G01R 23/165; G01R 23/167; G01R 33/3621
See application file for complete search history.

(56) References Cited

U.S. PATENT DOCUMENTS

| | | |
|---|---|---|
| 5,675,334 A | 10/1997 | McCartney |
| 5,804,979 A | 9/1998 | Lund et al. |
| 6,259,254 B1 * | 7/2001 | Klang ................ G01R 31/3648 324/427 |
| 6,380,747 B1 | 4/2002 | Goldfine et al. |
| 6,534,985 B2 | 3/2003 | Holladay, III et al. |
| 9,389,275 B2 | 7/2016 | Banarie et al. |
| 9,397,690 B2 | 7/2016 | Lasseuguette et al. |
| 2008/0103709 A1 * | 5/2008 | Yun ..................... G01R 31/389 702/63 |
| 2012/0004851 A1 | 1/2012 | Potyrailo et al. |
| 2013/0193982 A1 | 8/2013 | Banarie et al. |
| 2014/0253102 A1 | 9/2014 | Wood et al. |
| 2014/0354266 A1 | 12/2014 | Hurwitz et al. |

OTHER PUBLICATIONS

"Integrated, Precision Battery Sensor for Automotive Systems", Analog Devices—ADuC7039, (2013), 1-92.
Sherry, Adrian, "Chopping on Sigma-Delta ADCs", Analog Devices—AN-609 Application Note, (2003), 1-4.
Wong, Vicky, et al., "Zero-Drift Amplifiers: Now Easy to Use in High Precision Circuits", Analog Dialogue 49-07, (Jul. 2015), 1-4.

* cited by examiner

*Primary Examiner* — Tung X Nguyen

(74) *Attorney, Agent, or Firm* — Schwegman Lundberg & Woessner, P.A.

(57) ABSTRACT

Described are various current measurement techniques that can compensate for drift in shunt resistance. Determining a resistance of a shunt resistor, e.g., coupled to a battery terminal, can include introducing a known signal in sync with the chop phases of a dual system chop scheme, chopping the known signal out in the main signal path, and explicitly extracting the known signal in a parallel, additional signal deprocessing path.

20 Claims, 6 Drawing Sheets

CURRENT MEASUREMENT TECHNIQUES TO COMPENSATE FOR SHUNT DRIFT

FIELD OF THE DISCLOSURE

The present disclosure relates to current measurement apparatuses and methods.

BACKGROUND

In a shunt-based current measurement apparatus, the current is measured by inserting a known low resistance "shunt" in series with the current to be measured, and then measuring a voltage dropped across the series shunt. Application of Ohm's Law (current (I)=voltage (V)/resistance (R)) will yield the current flowing through the shunt. The accuracy of the current measurement can depend on the accuracy of the voltage measurement and the accuracy of the resistance of the shunt itself.

Typically, the system is factory calibrated, which can include temperature compensation over a number of temperature points to compensate for temperature effects of the shunt. For automotive applications, a single temperature calibration is often used. However, over the lifetime use of the shunt, its value can change independent of temperature and this can be unpredictable. Moreover, in the typical application, the current through the shunt is monitored continuously, and this can present challenges for monitoring the shunt itself. The shunt typically has less a resistance of less than one Ohm, which can add further challenges.

SUMMARY OF THE DISCLOSURE

This disclosure describes techniques that can be used to monitor the value of a shunt resistance while also monitoring the primary measurement of the current passing through the shunt itself.

In some aspects, this disclosure is directed to a method of determining a resistance of a shunt resistor coupled to a battery terminal. The method comprises receiving, on an input signal line, an input signal corresponding to a voltage across the shunt resistor; during a first conversion cycle: chopping the received input signal; converting a combination of the chopped input signal and an offset error to generate a first digital signal; de-chopping the first digital signal; filtering, using a first channel, the de-chopped first digital signal to determine a first output signal; and filtering, using a second channel, the first digital signal to determine a second output signal. The method further comprises applying a current through the shunt resistor. The method further comprises during a second conversion cycle, in the presence of the applied current through the shunt resistor: chopping the received input signal; converting a combination of the chopped input signal, the offset error, and a voltage generated by the applied current to generate a second digital signal; de-chopping the second digital signal; filtering, using the first channel, the de-chopped second digital signal to determine a third output signal; and filtering, using a second channel, the second digital signal to determine a fourth output signal. The method further comprises determining the resistance of the shunt resistor using the first, second, third, and fourth output signals.

In some aspects, this disclosure is directed to an apparatus for determining a resistance of a shunt resistor coupled to a battery terminal. The apparatus comprises a stimulus source configured to be coupled to an input signal line; an input chopping switch network configured to be coupled to the input signal line and to the stimulus source and configured to receive and chop an input signal corresponding to a voltage across the shunt resistor; a measurement channel circuit having an output and configured to receive the chopped input signal and to generate a digital output signal at the output; a first output channel circuit coupled to the output of the measurement channel circuit, the first output channel including: an output chopping switch network configured to be coupled to the output of the measurement channel circuit and configured to de-chop the digital output signal; and a first digital filter configured to receive the de-chopped digital output signal; and a second output channel circuit in parallel with the first output channel circuit and coupled to the output of the measurement channel circuit, the second output channel including a second digital filter configured to receive the digital output signal, wherein during a first conversion cycle, the first digital filter is configured to determine a first output signal and the second digital filter is configured to determine a second output signal, wherein during a second conversion cycle in the presence of the stimulus applied through the shunt resistor, the first digital filter is configured to determine a third output signal and the second digital filter is configured to determine a fourth output signal, the apparatus further comprising a processor configured to determine the resistance of the shunt resistor using the first, second, third, and fourth output signals.

In some aspects, this disclosure is directed to an apparatus for determining a resistance of a shunt resistor coupled to a battery terminal. The apparatus comprises means for receiving, on an input signal line, an input signal corresponding to a voltage across the shunt resistor; during a first conversion cycle: means for chopping the received input signal; means for converting a combination of the chopped input signal and an offset error to generate a first digital signal; means for de-chopping the first digital signal; means for filtering, using a first channel, the de-chopped first digital signal to determine a first output signal; and means for filtering, using a second channel, the first digital signal to determine a second output signal; means for applying a current through the shunt resistor; during a second conversion cycle, in the presence of the applied current through the shunt resistor: means for chopping the received input signal; means for converting a combination of the chopped input signal, the offset error, and a voltage generated by the applied current to generate a second digital signal; means for de-chopping the second digital signal; means for filtering, using the first channel, the de-chopped second digital signal to determine a third output signal; and means for filtering, using a second channel, the second digital signal to determine a fourth output signal; and means for determining the resistance of the shunt resistor using the first, second, third, and fourth output signals.

This overview is intended to provide an overview of subject matter of the present patent application. It is not intended to provide an exclusive or exhaustive explanation of the invention. The detailed description is included to provide further information about the present patent application.

Figure 1:
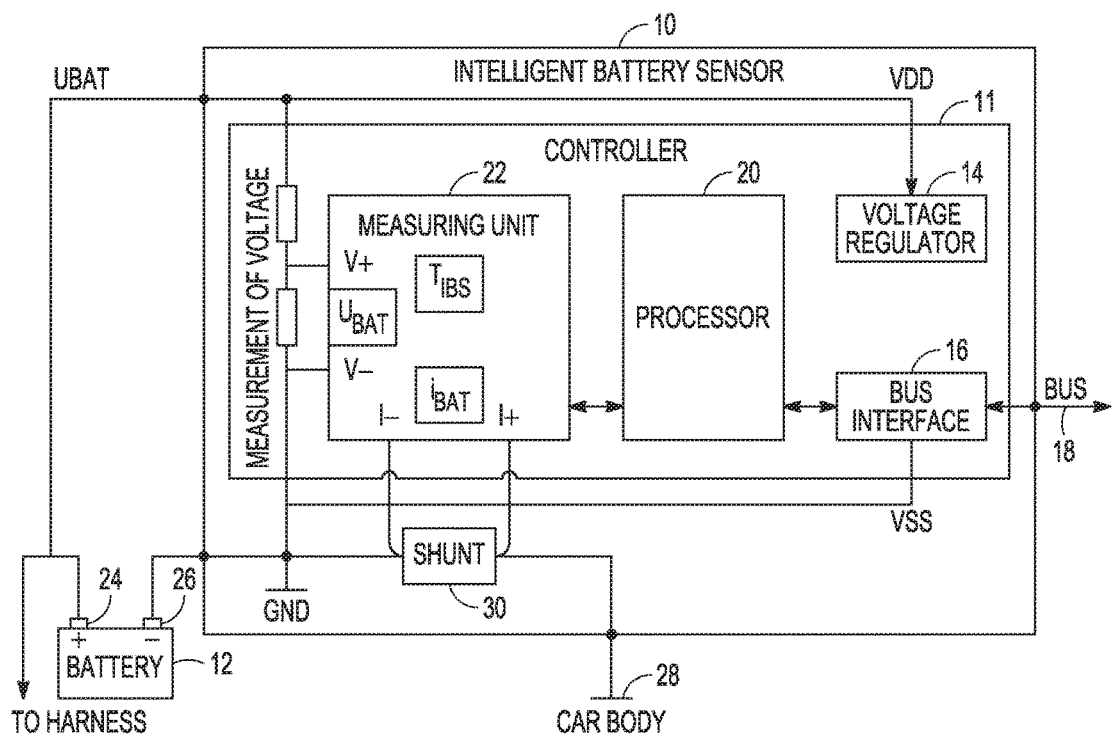
FIG. 1 is a block diagram of an example of an intelligent battery sensor that can implement various techniques of this disclosure.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In an intelligent Battery Sensing (IBS) application, a state of health (SOH), a state of charge (SOC), and a state of function (SOF) of the battery can be monitored by, in various modes of operation, directly measuring a battery voltage and also measuring a current delivered by the battery. The current is typically measured by placing a current shunt in series with one of the battery terminals and measuring the voltage dropped across this it. Application of Ohm's Law (current (I)=voltage (V)/resistance (R)) can derive the current. However, for the current measurement to be accurate, the resistance of the current shunt should be accurately known. Initially, the shunt can be measured on the factory floor and then the shunt can be offset/gain calibrated. Once the part containing the shut is out in the field connected to a battery, there is no effective way to monitor the value of the shunt itself because, in the field, there is always an unknown current (the battery current) flowing through the shunt.

To measure the shunt in the field, a known stimulus current can be applied to the shunt, and the effect of that known stimulus can be measured. The complication is that there is already an unknown current flowing through the shunt that can make such a shunt measurement impractical unless the unknown current and the applied known stimulus current are distinguishable from each other.

As discussed in detail below, this disclosure describes various current measurement techniques to compensate for drift in shunt resistance. For example, this disclosure describes techniques for determining the resistance of a shunt resistor, e.g., coupled to a battery terminal, that can include introducing a known signal in sync with the chop phases of a dual system chop scheme, chopping the known signal out in the main signal path, and explicitly extracting the known signal in a parallel, additional signal deprocessing path.

FIG. 1 is a block diagram of an example of an intelligent battery sensor that can implement various techniques of this disclosure. In the non-limiting example system shown in FIG. 1, the intelligent battery sensor 10 can used in an automotive application. In FIG. 1, the sensor 10 can be coupled to a vehicle battery 12. The sensor 10 can include a controller 11 that can include a voltage regulator 14, a bus interface 16 configured to couple to a bus 18 and a processor 20. The processor 20 can control a measuring unit 22 of the sensor. In some example implementations, a flash controller can control the access of processor 20 to/from EEPROM/Flash memory, for example. The sensor 10 can be coupled to the positive terminal 24 and the negative terminal 26 of the battery 12, thereby allowing the measuring unit 22 to receive at its inputs V+ and V− a representation of the battery voltage and determine the voltage of the battery 12 therefrom ("$U_{Bat}$" in FIG. 1).

The current from the battery 12 can be returned through the car chassis or car body 28. As seen in FIG. 1, a shunt resistor 30 can be coupled between the car body 28 and the negative terminal 26 of the battery 12. The sensor 10 can be coupled across the shunt resistor 30, thereby allowing the measuring unit 22 to receive at its inputs I+ and I− a representation of the voltage across the shunt resistor. Using the voltage, the measuring unit 22 can determine the current through the shunt resistor 30, e.g., the battery current ("$I_{Bat}$" in FIG. 1).

In some example implementations, the positive terminal 24 of the battery 12 can be used instead of the negative terminal 26.

As described in detail below, the measuring unit can inject a known signal, e.g., current, through the shunt resistor 30 in phase with a chopping cycle, chop the known signal out in the main signal path, and explicitly extract the known signal in a parallel, additional signal deprocessing path.

Figure 2:
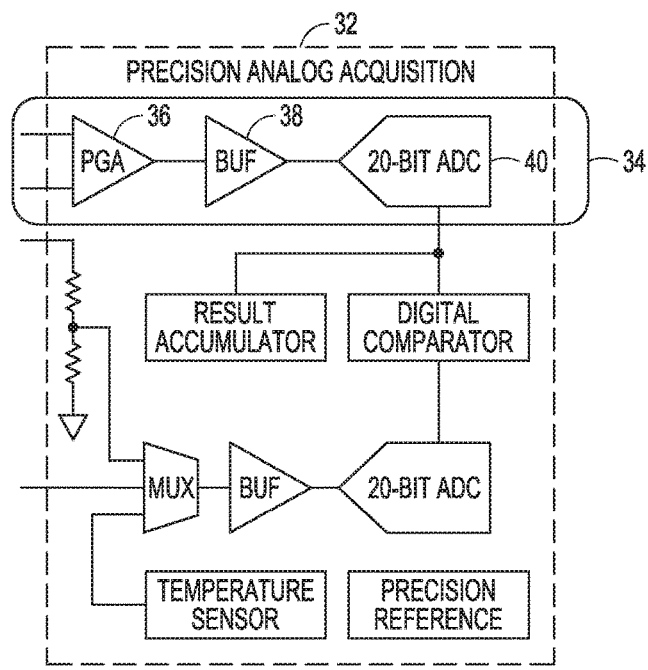
FIG. 2 is a block diagram of an example of a front end circuit portion of a measuring unit that can implement various techniques of this disclosure.

FIG. 2 is a block diagram of an example of a front end circuit portion of a measuring unit 22 that can implement various techniques of this disclosure. In particular, the front end circuit portion 32 of the measuring unit 22 (of FIG. 1) can include a measurement channel circuit 34, e.g., current or voltage measurement, that can include a programmable gain amplifier 36 (PGA), a buffer 38 (BUF), and an analog-to-digital converter 40 (ADC). In some example configurations, the measuring unit 22 can include a level shifter (not depicted), e.g., positioned before the PGA, for shilling up the voltage potential below ground potential. The measurement channel 34 is described below with respect to FIG. 3 with a chopping scheme that can be used to implement various techniques of this disclosure.

The process of chopping is an effective technique to remove, for example, unwanted offset voltage drift that may cause measurement error. Chopping can effectively remove low frequency noise, including DC noise, that can be an error source contributed as a result of offset voltage drift in the system because the process of chopping relies to a large extent on the offset drift to be equal over the full period of a measurement cycle. Offset voltage drift can be caused by various factors, such as temperature change, physical stress, general life wearout or other mechanisms. Chopping at a system level, e.g., for at least a majority of the signal path, can allow for variance in offset errors introduced by the system to be cancelled out and removed from the signal path, thus allowing for the signal of interest to be extracted from the measurement system.

Figure 3:
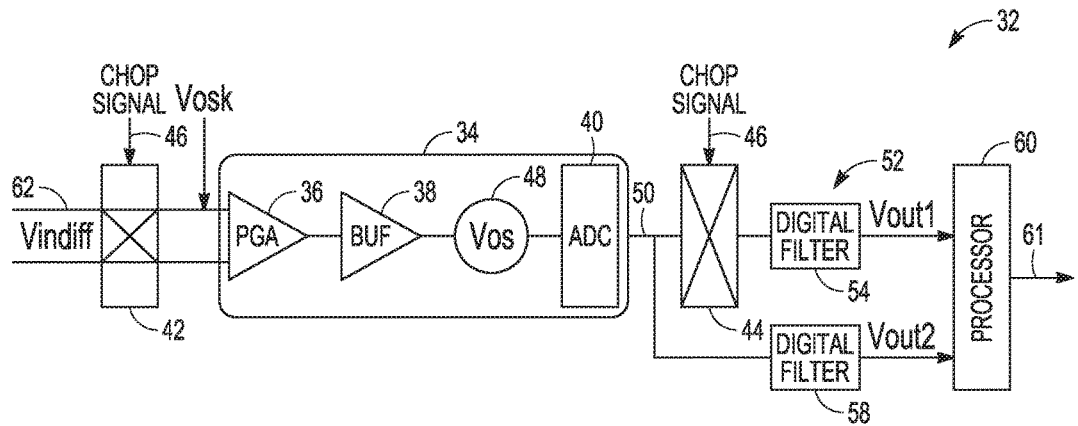
FIG. 3 is a block diagram of an example of a portion of a front end circuit that can implement various techniques of this disclosure.

FIG. 3 is a block diagram of an example of a portion of a front end circuit 32 that can implement various techniques of this disclosure. The circuit 32 can include two chopping switch networks, namely an input chopping switch network 42 and an output chopping switch network 44 (or "de-chop network" 42). The input chopping switch network 42 can be referred to as "chop switches", and the output chopping switch network 44 can be referred to as "de-chop switches" and as output de-chopping switch network 44. For clarity, individual switches of the switch networks have not been depicted.

Generally speaking, the purpose of the output chopping switch network 44 is to reinstate the polarity change that the front end chop cycle (performed by the input chopping switch network 42) caused to the signal, which complies with the mathematic expressions described below. This backend polarity reinstatement can be performed in a number of different ways. For example, the output chopping switch network can simply multiply a digital signal by −1. In particular examples that include a sigma delta modulator, the output chopping switch network 44 can be an inverter, where inverting the bit stream that comes from the modulator effectively reverses the polarity of the bits in the bit stream.

As another example, the actual signal path can inverted at the back end just like at the switches at the front end, typically where an analog filter is used. This can be a scheme with a following analog filter. Any offsets can average out over the chop phases. Whether multiplied by −1, inverted, or the result of switches, the backend polarity reinstatement caused by the output chopping switch network 44 will be referred to generally as "de-chopping" in this disclosure.

Each chopping switch network 42, 44 can be configured to receive a chop signal 46 that can control the operation of the respective chopping switch network. As is well known, upon receiving the chop signal 46, the inputs to a chopping switch network, e.g., input chopping switch network 42, can be alternatively reversed. An example timing diagram is shown and discussed below with respect to FIG. 4.

In FIG. 3, the measurement channel circuit 34 can include, among other things, a programmable gain amplifier 36 to amplify the modulated signal from the input chopping switch, a buffer 38, and an analog-to-digital converter (ADC) 40 configured to convert the analog input signal to a digital signal. The ADC 40 can include a delta-sigma ADC, a pipelined ADC, a successive approximation routine (SAR) ADC, a pipelined SAR ADC, as well as other ADCs.

Also depicted is an offset error source Vos 48 that represents the unwanted offset error of the measurement channel circuit 34. The offset error can be caused by, for example, multiplexor connections, amplifier offset, output switches, thermal offset drift, and the like.

The output 50 of the measurement channel circuit 34 can be coupled to two parallel output channels. In a first output channel 52 (a fully chopped channel), the measurement channel circuit 34 can be coupled to a first digital filter 54 through the output de-chopping switch network 44. In a second output channel 56 (a partially chopped channel) coupled in parallel with the first output channel 52, the measurement channel circuit 34 can be coupled to a second digital filter 58 without being coupled to a de-chopping switch network. In some examples, the first and second digital filters 54, 58 can be a singular 'digital entity' that keeps the signal path information separate within itself.

In some examples, the first and second digital filters can be coupled to or form a part of a processor 60 of the measuring unit 22 (of FIG. 1). The processor 60 can determine, among other things, the resistance of the shunt resistor using the output signals Vout1 and Vout2 and output the result at 61.

The measurement channel circuit 34 can receive an input signal "Vindiff" (also referred to in this disclosure as "Vin") on an input signal line 62. For example, the input signal Vindiff can correspond to a voltage across a shunt resistor, e.g., the voltage across the shunt resistor 30 of FIG. 1. In FIG. 3, the differential input of the measurement channel circuit 34 can be connected to the input signal line 62 via the input chopping switch network 42 (or "chop network" 42).

In accordance with this disclosure and described in more detail below, a known offset signal, depicted as "Vosk" in FIG. 3, can be applied on the input signal line. That is, a known stimulus or excitation can be used to excite the external current shunt resistor such that an additional shunt dependent offset can be introduced into the measurement system. This excitation Vosk can be added to the first and second output channels in phase with the unwanted (and unknown) offset voltage Vos. By artificially introducing a known stimulus offset Vosk, e.g., on the right hand side of the input chopping switch network 42, it can be removed on the fully chopped path, e.g., the first output channel, as it would appear like another version of the offset Vos. The known signal only represents a static addition to the offset voltage Vos. By applying a known signal in sync with the chop phases, the effect of the known signal can be cancelled out with the unknown offset voltage Vos.

Introducing a parallel output path, without chopping/inversion, can allow extraction of the effect introduced by the newly introduced known signal. In other words, the effect of a known stimulus can be chopped out in the main signal path but extracted explicitly in parallel by an additional signal deprocessing path. Using the two output paths/channels and two conversion cycles, the input voltage Vindiff and the offset voltage Vos can be determined, thereby allowing the resistance of the current shunt to be determined in parallel to the measurement of the battery current, or temporally simultaneous to the battery current measurement, or without interrupting primary battery current measurement itself, for example.

Figure 4:
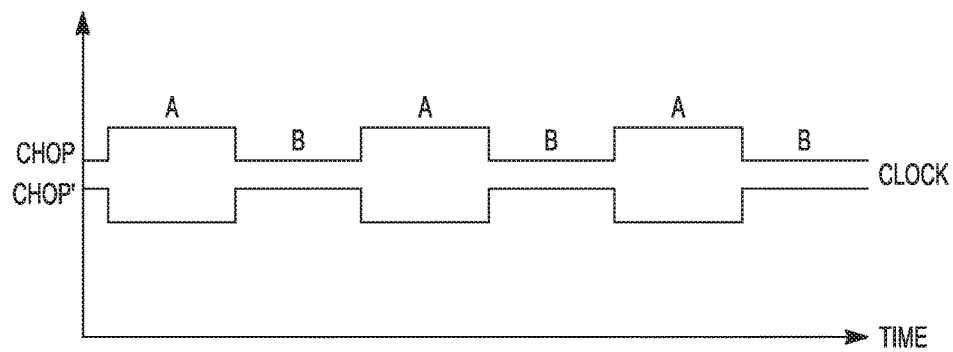
FIG. 4 is an example of a chopping timing diagram.

FIG. 4 is an example of a chopping timing diagram. The chop signals CHOP and CHOP' can be controlled by a clock generator and can be used to reduce or eliminate any undesirable offset error present. CHOP and CHOP' can be complimentary signals to drive NMOS and PMOS based switches that need complimentary signals.

When the CHOP signal is high (phase "A"), the differential input signal can be coupled without inversion to the measurement channel circuit 34 of FIG. 3, and the output 50 of the measurement channel circuit 34 can be coupled without inversion to the first and second digital filters 54, 58. When the CHOP signal is high (phase "B"), the differential input signal can be coupled with inversion to the measurement channel circuit 34, and the output 50 of the measurement channel circuit 34 can be coupled with inversion to the first digital filter 54.

Figure 5:
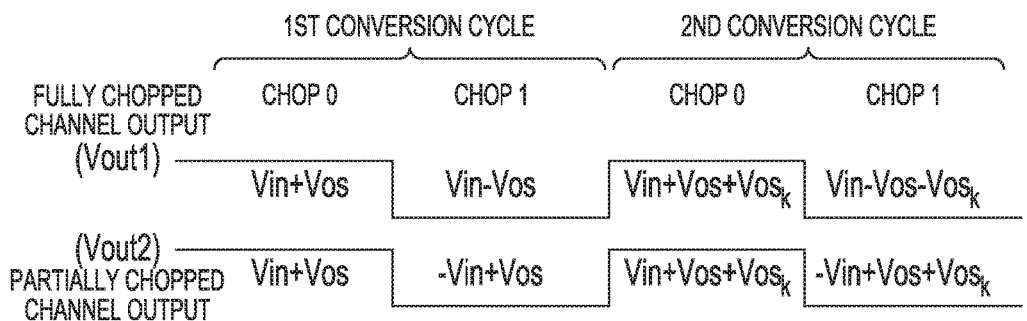
FIG. 5 is a conceptual diagram depicting an example conversion sequence and resulting output using various techniques of this disclosure.

FIG. 5 is a conceptual diagram depicting an example conversion sequence and resulting output using various techniques of this disclosure. FIG. 5 depicts two conversion sequences or cycles, each sequence including a Chop0 and a Chop1 phase. The output of the first and second output channels of FIG. 3 is depicted at each of the two phases "Chop0" and "Chop1". The first output channel is a "fully chopped" channel because it is chopped and de-chopped, whereas the second output channel is a "partially chopped" channel because it is chopped at front end only (no de-chopping). Again, chopping refers to the action of the front end switches, e.g., the input chopping switch network 42 of FIG. 3, and de-chopping refers to the reverse, complimentary action on the back end switches, e.g., of the output chopping switch network 44 of FIG. 3. During a first conversion sequence and before the known offset is applied, the output Vout1 of the first output channel is (Vin+Vos) after the first phase Chop0 and (Vin−Vos) after the second phase Chop1. From these two output results, the measuring unit 22 of FIG. 1 can determine Vin.

Similarly, and during the same conversion sequence and before the known offset is applied, the output Vout2 of the second output channel is (Vin+Vos) after the first phase Chop0 and (−Vin+Vos) after the second phase Chop1. From these two output results, the measuring unit 22 of FIG. 1 can determine Vos.

During a second conversion sequence and after the known offset Vosk is applied, the output Vout1 of the first output channel is (Vin+Vos+Vosk) after the first phase Chop0 and (Vin−Vos−Vosk) after the second phase Chop1. From these two output results, the measuring unit 22 of FIG. 1 can determine Vin as shown in Equations 1 and 2 below:

$$Vout_1=(Vin-(-Vin)+Vos-Vos+Vos_k-Vos_k)/2 \qquad \text{Eq. 1}$$

$$Vout_1=Vin \qquad \text{Eq. 2}$$

Similarly, during the second conversion sequence and after the known offset Vosk is applied, the output Vout2 of the second output channel is (Vin+Vos+Vosk) after the first phase Chop0 and (−Vin+Vos+Vosk) after the second phase Chop1. From these two output results, the measuring unit 22 of FIG. 1 can determine (Vos+Vosk) as shown in Equations 3 and 4 below:

$$Vout_2=(Vin+(-Vin)+Vos+Vos+Vos_k+Vos_k)/2 \qquad \text{Eq. 3}$$

$$Vout_2=Vos+Vos_k \qquad \text{Eq. 4}$$

As indicated above, the offset voltage Vos was determined after the first conversion sequence, thereby allowing the measuring unit 22 to determine the offset voltage Vosk of Eq. 4. The offset voltage Vosk can be generated using an accurate current source of known value. Again, the offset voltage Vosk is the voltage dropped across the shunt resistor. Using Ohm's law, the resistance of the shunt resistor can be determined from the determined offset voltage Vosk and from the known value of the current source. In this manner, the value of the shunt resistor can be determined continuously or periodically, thereby improving the accuracy of the battery current measurement.

As seen above, the separation of Vos and Vosk can be performed over two full conversion cycles. In some examples, multiple conversion cycles can be used to iteratively determine a plurality of values of Vosk from which an average or other central tendency of Vosk can be determined. Typically, Vos and Vosk are small and in order to extract their values from noise in the measurements, averaging can be used.

Figure 6:
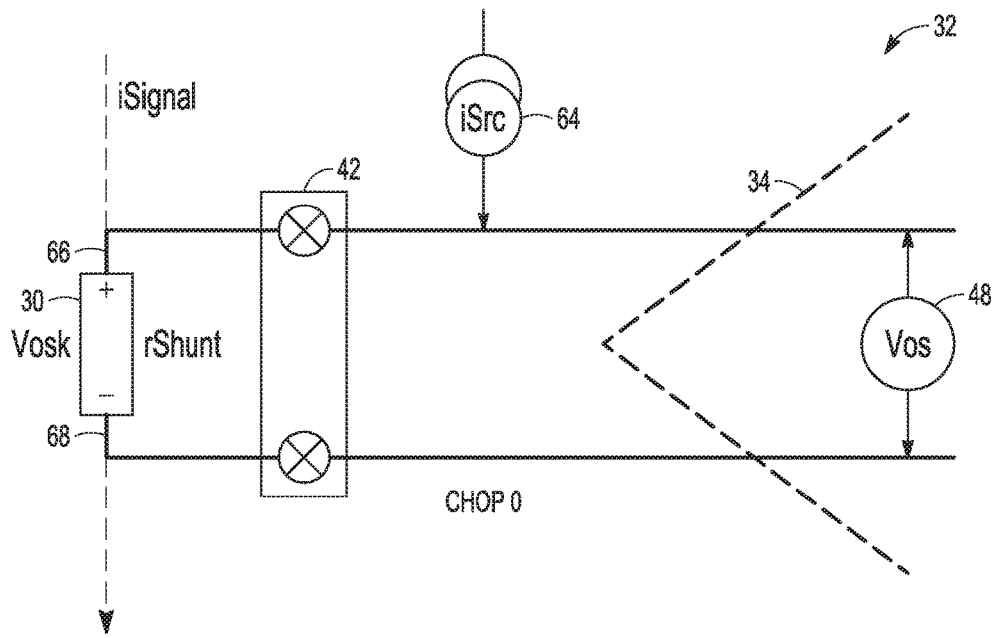
FIG. 6 is a portion of the front end circuit of FIG. 3 during a first chop phase.

FIG. 6 is a portion of the example front end circuit 32 of FIG. 3 during a first chop phase. During the first chop phase, e.g., phase Chop0, a battery current having an unknown value of "iSignal" flows through the shunt resistor 30, e.g., the shunt resistor 30 of FIG. 1, having a resistance of "rShunt." A stimulus source 64, e.g., a current source, can be coupled without inversion through the first chopping switch network 42 and can apply a stimulus, e.g., a current of known value "iSrc", in phase with "iSignal" creating a voltage drop of iSrc*rShunt=Vosk across the shunt resistor 30.

In some example implementations, a 4-wire measurement system can be used to counteract unwanted voltage drops in the signal path, caused by in signal path series resistance and thus improve accuracy. For example, in FIG. 6, the 4-wire measurement system can include a first pair of wires 66 coupled to a first terminal of the shunt resistor 30 and a second pair of wires 68 coupled to a second terminal of the shunt resistor 30. The current source 64 can apply a current using two of the four wires and the other two wires can be used to perform the measurements.

Figure 9:
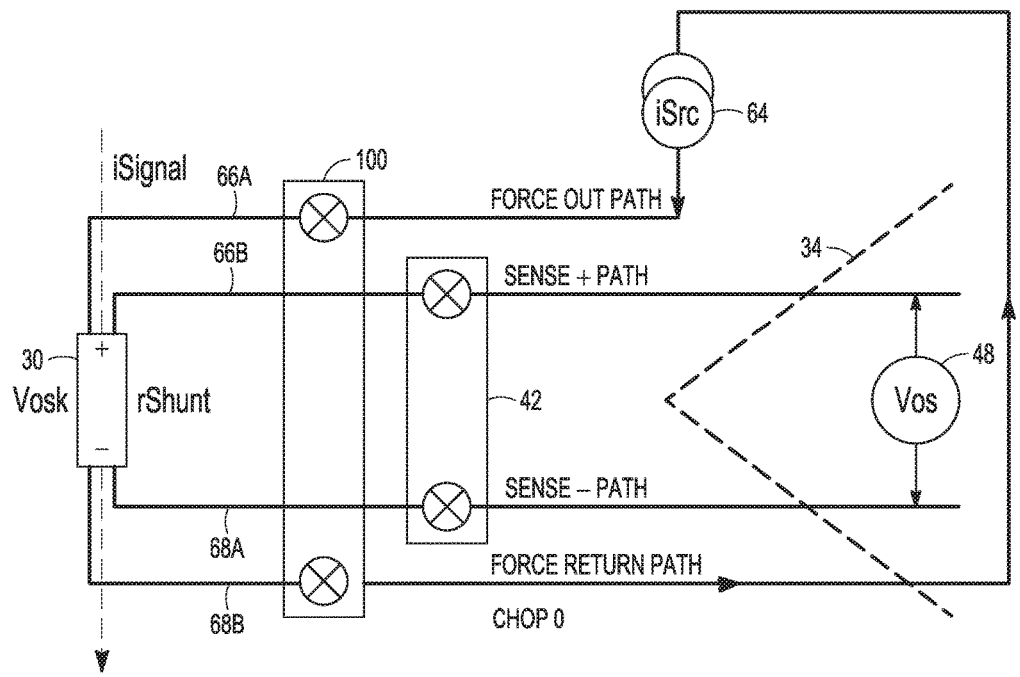
FIG. 9 is a portion of the front end circuit of FIG. 3 during a first chop phase using a 4-wire measurement configuration.
Figure 10:
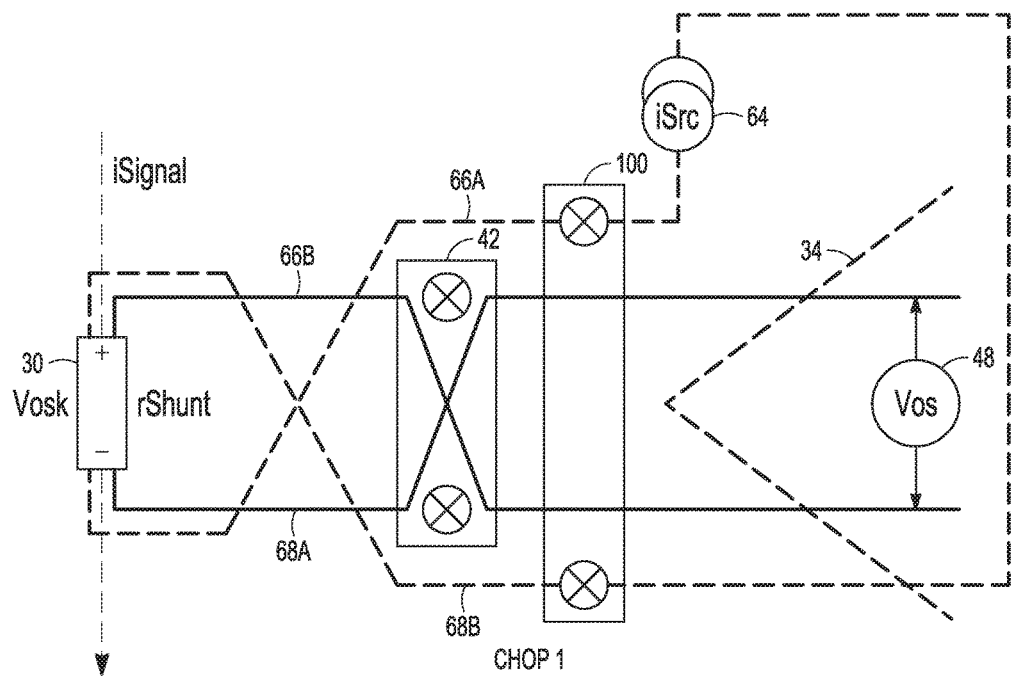
FIG. 10 is a portion of the front end circuit of FIG. 9 daring a second chop phase using the 4-wire measurement configuration.

In some example implementations using a 4-wire measurement system, the current source 64 can be coupled on the left hand side of the input chopping switch network 42. In at least one such implementation, the measuring unit 22 (of FIG. 1) can control the current source such that the polarity of the current source can be inverted between alternating chop phases. For example, in FIG. 6, during Chop0 the current of known value can be "iSrc" and in the second chop phase, e.g., Chop1 of FIG. 7, the current of known value can be "−iSrc". An example 4-wire measurement configuration is shown in FIGS. 9 and 10.

Figure 7:
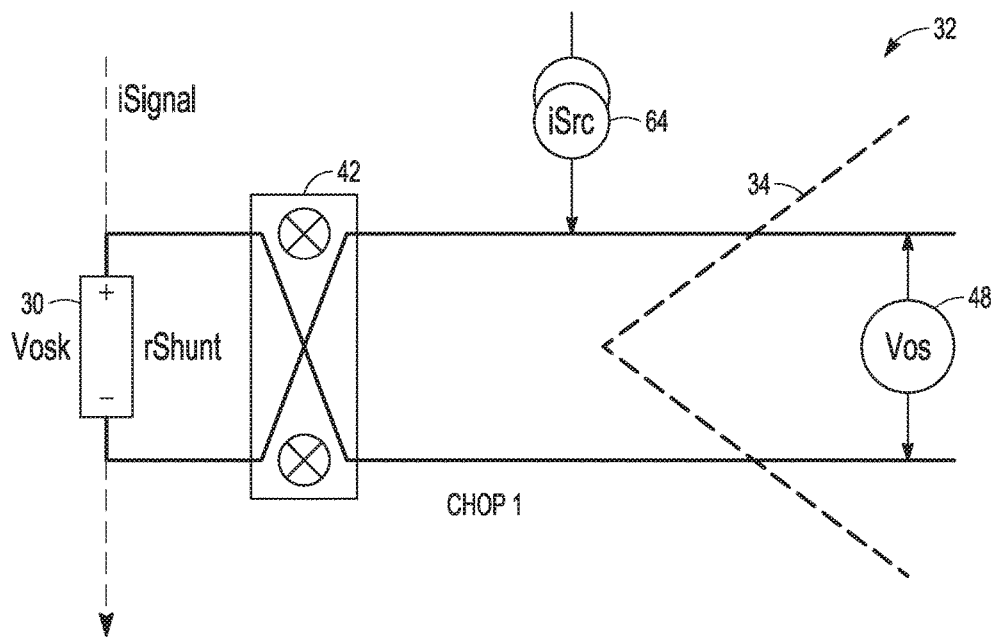
FIG. 7 is a portion of the example front end circuit of FIG. 3 during a second chop phase.

FIG. 7 is a portion of the example of the front end circuit of FIG. 3 during a second chop phase. The current source 64 can be coupled with inversion through the first chopping switch network 42 and can apply a current of known value "iSrc" in antiphase with "iSignal." That is, due to the action of the input chopping switch network 42 during the second chop phase, iSrc and iSignal have opposite polarities. Thus, the offset voltage Vosk iSrc*rShunt is still in phase with the unknown offset voltage Vos and can be eliminated on the first output channel, e.g., the fully chopped channel, as described above with respect to the conversion sequence diagram of FIG. 5.

In some example implementations, such as when one terminal of the shunt resistor is grounded, pushing a current into the grounded terminal can present challenges in practice. For example, in a configuration such as shown in FIG. 7, it can be challenging to push "iSrc" into the terminal of shunt resistor 30 if the terminal was coupled to ground. In some such configurations, it can be desirable to instead apply "iSrc" during the chop phases in which the current is pushed into the ungrounded terminal of the shunt resistor, e.g., Chop0 of FIG. 6. Then, during altering chop phases, e.g., alternating Chop0 phases, the measuring unit can invert the polarity of "iSrc." Such a configuration would produce results similar to those described above with respect to FIG. 5.

Figure 8:
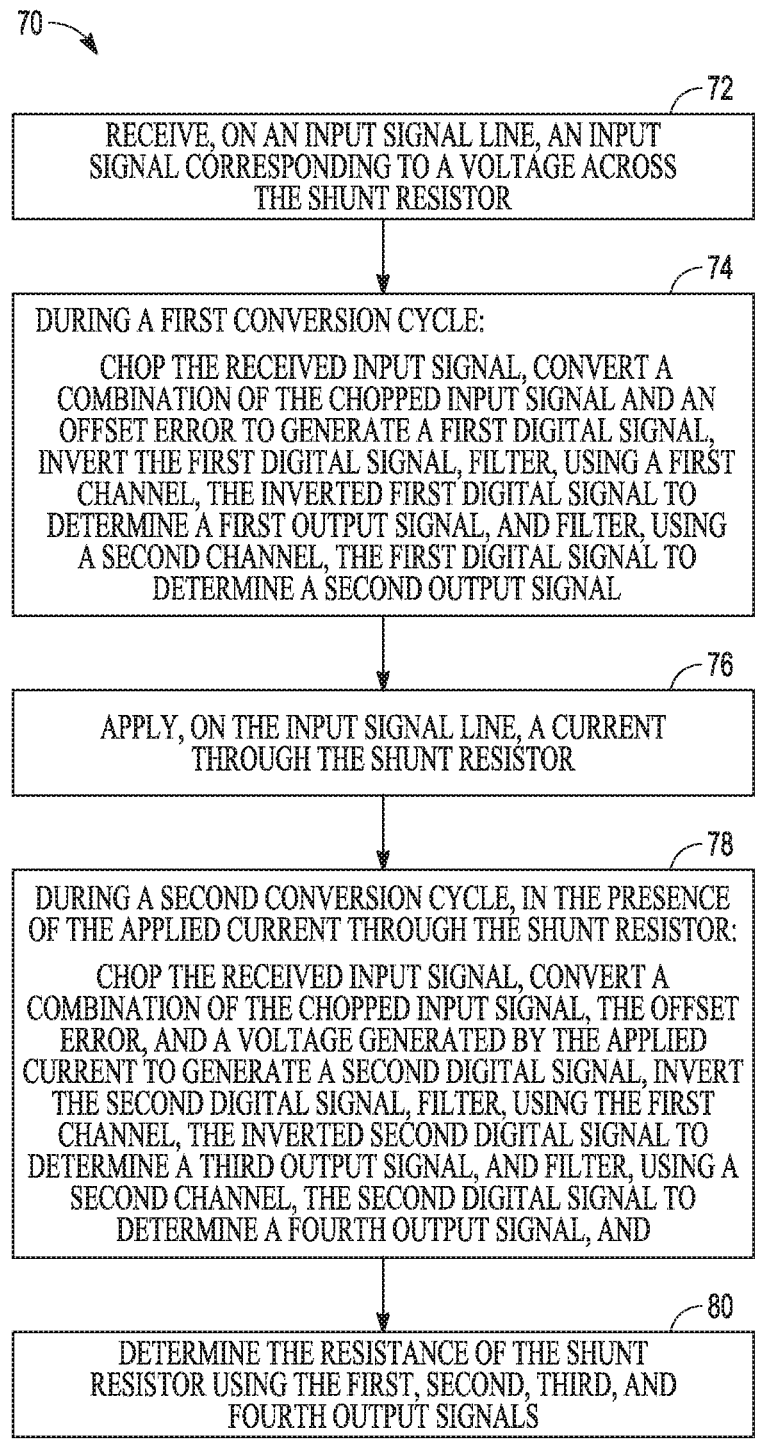
FIG. 8 is a flow diagram depicting an example method of determining a resistance of a shunt resistor coupled to a battery terminal.

FIG. 8 is a flow diagram depicting an example method of determining a resistance of a shunt resistor coupled to a battery terminal. In the method 70 of FIG. 8, at block 72, a circuit, e.g., the measuring unit 22 of FIG. 1, can receive an input signal, e.g., a differential voltage signal (Vin or Vin-diff) that can correspond to a voltage across the shunt resistor, e.g., the shunt resistor 30 of FIG. 1. At block 74 and during a first conversion cycle, e.g., the first conversion cycle of FIG. 5, the method 70 can include chopping the received input signal, e.g., via the input chopping switch network 42 of FIG. 3.

The method 70 can include converting a combination of the chopped input signal and an offset error, e.g., Vos of FIG. 3, to generate a first digital signal at output 50, e.g., using the ABC 40 of FIG. 3. The method 70 can include inverting the first digital signal, e.g., using the output chopping switch network 44 of FIG. 3. The method 70 can include filtering, using a first output channel, the inverted first digital signal to determine a first output signal. For example, using the fully chopped channel, the measuring unit 22 can use the first digital filter 54 of FIG. 3 to filter the inverted first digital signal to determine a first output signal of Vout1=(Vin−Vos).

The method 70 can include filtering, using a second output channel, the first digital signal to determine a second output signal. For example, using the partially chopped channel, the measuring unit 22 can use the second digital filter 58 of FIG. 3 to filter the first digital signal to determine a second output signal of Vout2=(−Vin+Vos).

At block 76, the method 70 can include applying, on the input signal line, a current through the shunt resistor. For example, the measuring unit 22 can apply, e.g., using the current source 64 of FIG. 6, a current of known value on the input signal line 62 through the shunt resistor 30.

At block 78 and during a second conversion cycle in the presence of the applied current through the shunt resistor, e.g., the second conversion cycle of FIG. 5, the method 70 can include chopping the received input signal, e.g., via the input chopping switch network 42 of FIG. 3.

The method 70 can include converting a combination of the chopped input signal, an offset error, e.g., Vos of FIG. 3, and a voltage generated by the applied current to generate a second digital signal to generate a second digital signal at output 50, e.g., using the ADC 40 of FIG. 3. The method 70 can include de-chopping the second digital signal, e.g., using the output chopping switch network 44 of FIG. 3.

The method 70 can include filtering, using the first output channel, the inverted second digital signal to determine a third output signal. For example, using the fully chopped channel, the measuring unit 22 can use the first digital filter 54 of FIG. 3 to filter the de-chopped second digital signal to determine a third output signal of Vout1=(Vin+Vos+Vosk).

The method 70 can include filtering, using the second output channel, the second digital signal to determine a fourth output signal. For example, using the partially chopped channel, the measuring unit 22 can use the second digital filter 58 of FIG. 3 to filter the second digital signal to determine a fourth output signal of Vout2=(−Vin+Vos+Vosk).

At block 80, the method can include determining, e.g., using the processor 60 of FIG. 4, the resistance of the shunt resistor using the first, second, third, and fourth output signals. For example, as described above, after having determined the offset voltage Vosk using the first, second, third, and fourth output signals, the resistance of the shunt resistor can be determined from the determined offset voltage Vosk and from the known value of the current source using Ohm's law.

In some example configurations, one or both of the first digital filter 54 and the second digital filter 58 can include a digital sine filter. The use of a sine filter can help mitigate the effects of any initial changes. For example, the current source can have a slew rate as it turns fully on. A sine filter can be weighted to help mitigate the effects of the slewing behaviour.

In some example configurations, one or both of the first digital filter 54 and the second digital filter 58 can provide a blanking or windowing period (or other sampling adjustments) during which initial samples can be ignored. Blanking techniques can be used to mitigate the effects of the initial short settling period after the application of the current source. Blanking can include, for example, not measuring or taking any samples for a very short time at the start of each relevant measurement.

In addition, the method 70 can include determining a battery current using the first, second, third, and fourth output signals. As described above with respect to FIG. 5, the voltage dropped across the shunt resistor due to the battery current, namely Vin or Vindiff, can be determined following the first conversion sequence by determining (Vin+Vos) and (Yin−Vos). Then, the battery current can be determined from Vin and the resistance of the shunt using Ohm's law.

In some example implementations, the method can include applying, on the input signal line, a current through the shunt resistor during each conversion cycle, e.g., both the first and second conversion cycles, but altering the magnitude of the current during the second conversion cycle. That is, during the first conversion cycle, a current having a first magnitude can be applied and during the second conversion cycle, a current having a second magnitude different than the first magnitude can be applied. For example, the second magnitude, e.g., 2×, 3×, 4×, can be greater than the first magnitude, e.g., 1×. Applying the current during each of the conversion cycles, e.g., the first and second conversion cycles, can mitigate any thermal changes in the resistance of the shunt resistor.

In some example configurations, in addition to or in place of applying a known stimulus, e.g., current, a known resistance can be added into the measurement circuit to help determine the value of the resistance of the shunt resistor. For example, the measurement unit of FIG. 1 can control switches to couple a resistor having a known resistance in series with the shunt resistor. A first measurement can be made without the resistor switched into the circuit and a second measurement can be made with the resistor switched into the circuit. Using various techniques described above, the measuring unit can determine a difference between the first and second measurements and can determine a resistance of the shunt resistance using the determined difference.

FIG. 9 is a portion of the front end circuit of FIG. 3 during a first chop phase using a 4-wire measurement configuration. In FIG. 9, the 4-wire measurement system can include a first pair of wires 66A, 66B coupled to a first terminal of the shunt resistor 30 and a second pair of wires 68A, 68B coupled to a second terminal of the shunt resistor 30. In addition to the input chopping switch network 42, the 4-wire implementation can include another input chopping switch network 100. The current source 64 can apply a current using two of the four wires, e.g., wires 66A, 68A of the "force out" and "force return" paths, through the input chopping network 100 and the other two wires, e.g., wires 66B, 68B of the "sense+" and "sense−" paths, can be used to perform the measurements through the input chopping network 42. FIG. 9 depicts the configuration during the Chop0 phase and with a current of known value of "iSrc".

FIG. 10 is a portion of the front end circuit of FIG. 9 during a second chop phase using the 4-wire measurement configuration. FIG. 10 depicts the configuration during the Chop1 phase. The measuring unit 22 (of FIG. 1) can control the switches 42, 100 such that the polarity of the current source 64 can be inverted between alternating chop phases. The current source 64 can be coupled with inversion through the input chopping switch network 100 and can apply a current of known value "−iSrc" in antiphase with "iSignal." The input chopping network 42 on the sense wires, e.g., wires 66B, 68B, can be inverted as shown. Essentially, the current path, e.g., through wires 66A, 68A, can be flipped in sympathy with the inversion of the sense wires, e.g., wires 66B, 68B.

Figure 11:
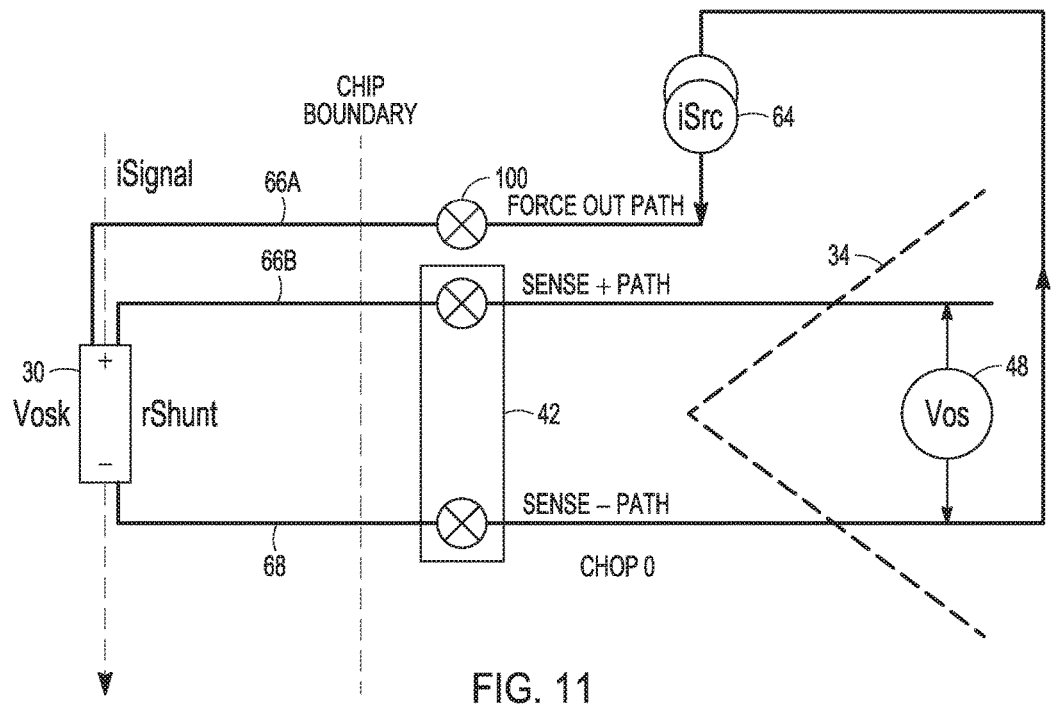
FIG. 11 is a portion of the front end circuit of FIG. 3 during a first chop phase using a 3-wire measurement configuration.

FIG. 11 is a portion of the front end circuit of FIG. 3 during a first chop phase using a 3-wire measurement configuration. In FIG. 11, the 3-wire measurement system can include a first pair of wires 66A, 66B coupled to a first terminal of the shunt resistor 30 and a third wire 68 coupled to a second terminal of the shunt resistor 30. In addition to the input chopping switch network 42, the 3-wire implementation can include another input chopping switch network 102.

The current source 64 can apply a current using one of the three wires, e.g., wire 66A of the "force out path," through the input chopping switch network 102. The other two wires, e.g., wires 66B, 68 of the "sense+" and "sense–" paths, can be used to perform the measurements through the input chopping network 42. FIG. 11 depicts the configuration during the Chop0 phase and with a current of known value of "iSrc".

The excitation current "iSrc" can be pushed out through the shunt resistor 30 and returned on a separate "force return" path (not shown). Although the configuration shown in FIG. 11 can include voltage drops due to series resistances, e.g., resistances in the wires, joints, ESD protection resistance internal to the part, and the like, the current can be constant. The impedance of the measurement channel circuit 34 can be very high, thus there can be negligible current flowing into the measurement channel circuit 34 itself on the sense path via wire 68A. Therefore, there can be negligible voltage drop on the sense path and, as a result, the I*rShunt voltage drop can be accurately presented to the ADC.

Thus, the 3-wire configuration can be more accurate than a 2-wire implementation. Compared to a 4-wire implementation, the 3-wire implementation can save one wire but at the expense of potential inaccuracy due to I*R drops on the current return path, which can be shared with the ADC Sense–.

Figure 12:
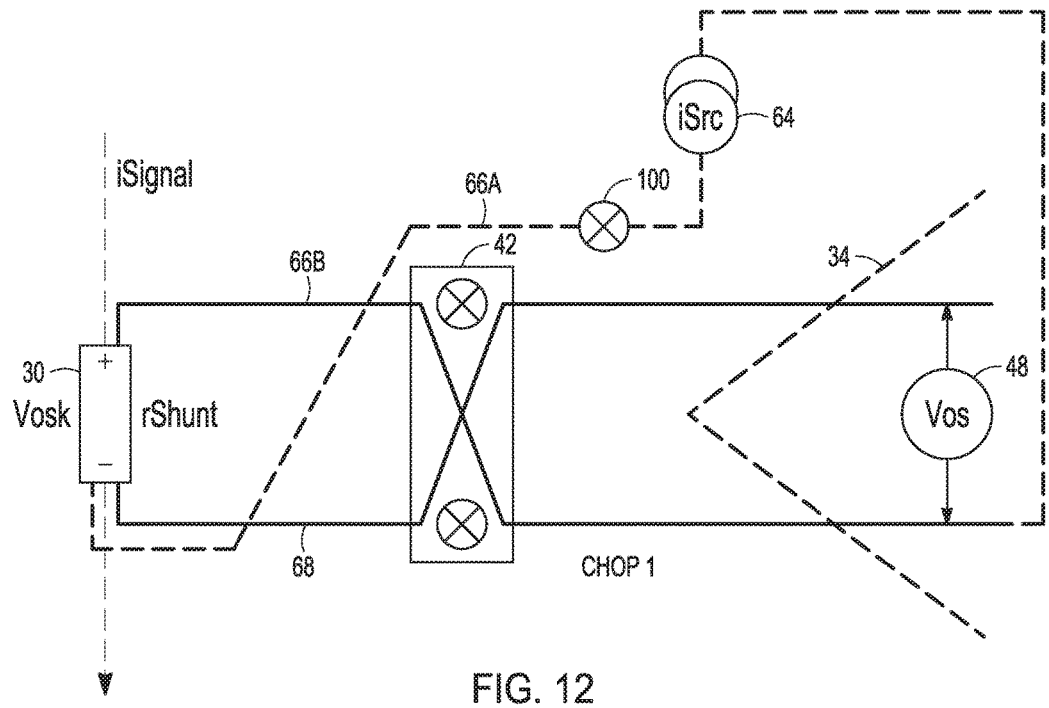
FIG. 12 is a portion of the front end circuit of FIG. 3 during a second chop phase using a 3-wire measurement configuration.

FIG. 12 is a portion of the front end circuit of FIG. 11 during a second chop phase using the 3-wire measurement configuration. FIG. 12 depicts the configuration during the Chop1 phase. The measuring unit 22 (of FIG. 1) can control the switches 42, 100 such that the polarity of the current source 64 can be inverted between alternating chop phases. The current source 64 can be coupled with inversion through the input chopping switch network 100 and can apply a current of known value "–iSrc" in antiphase with "iSignal." The input chopping network 42 on the sense wires, e.g., wires 66B, 68B, can be inverted as shown. Essentially, the current path, e.g., through the wire 66A, can be flipped in sympathy with the inversion of the sense wires, e.g., wires 66B, 68B.

VARIOUS NOTES

Aspect 1 includes subject matter (such as a method, means for performing acts, machine readable medium including instructions that when performed by a machine cause the machine to performs acts, or an apparatus configured to perform) for determining a resistance of a shunt resistor coupled to a battery terminal. The subject matter comprises receiving, on an input signal line, an input signal corresponding to a voltage across the shunt resistor; during a first conversion cycle: chopping the received input signal; converting a combination of the chopped input signal and an offset error to generate a first digital signal; de-chopping the first digital signal; filtering, using a first channel, the de-chopped first digital signal to determine a first output signal; and filtering, using a second channel, the first digital signal to determine a second output signal. The subject matter comprises applying a current through the shunt resistor; during a second conversion cycle, in the presence of the applied current through the shunt resistor: chopping the received input signal; converting a combination of the chopped input signal, the offset error, and a voltage generated by the applied current to generate a second digital signal; de-chopping the second digital signal; filtering, using the first channel, the de-chopped second digital signal to determine a third output signal; and filtering, using a second channel, the second digital signal to determine a fourth output signal; and determining the resistance of the shunt resistor using the first, second, third, and fourth output signals.

In Aspect 2, the subject matter of Aspect 1 can optionally include determining a battery current using the first, second, third, and fourth output signals.

In Aspect 3, the subject matter of one or more of Aspects 1 and 2 can optionally include iteratively repeating the receiving, chopping, converting, de-chopping, filtering, applying, and determining.

In Aspect 4, the subject matter of one or more of Aspects 1-3 can optionally include, wherein applying a current through the shunt resistor includes: applying a current having a known value from a current source through the shunt resistor.

In Aspect 5, the subject matter of one or more of Aspects 1-3 can optionally include, wherein applying a current through the shunt resistor includes: applying a current through the shunt resistor using first and second wires of a 4-wire measurement system.

In Aspect 6, the subject matter of Aspect 5 can optionally include, wherein applying a current through the shunt resistor using first and second wires of a 4-wire measurement system includes: during alternating chop phases of the second conversion cycle, de-chopping the current.

In Aspect 7, the subject matter of one or more of Aspects 1-3 can optionally include, wherein applying a current through the shunt resistor includes: applying a current through the shunt resistor using a first wire of a 3-wire measurement system.

In Aspect 8, the subject matter of one or more of Aspects 1-7, wherein the applied current through the shunt resistor is a first current, the method further comprising: prior to the first conversion cycle, applying a second current through the shunt resistor, wherein the first current is different from the second current.

In Aspect 9, the subject matter of one or more of Aspects 1-8, wherein applying a current through the shunt resistor includes: during a first chop phase of the second conversion cycle, applying the current having a first polarity; and during a second chop phase of the second conversion cycle, applying the current having a polarity opposite the first polarity.

Aspect 10 includes subject matter (such as a device, system, circuit, apparatus, or machine) for determining a resistance of a shunt resistor coupled to a battery terminal, the subject matter comprising: a stimulus source configured to be coupled to an input signal line; an input chopping switch network configured to be coupled to the input signal line and to the stimulus source and configured to receive and chop an input signal corresponding to a voltage across the shunt resistor; a measurement channel circuit having an output and configured to receive the chopped input signal and to generate a digital output signal at the output; a first output channel circuit coupled to the output of the measurement channel circuit, the first output channel including: an output chopping switch network configured to be coupled to the output of the measurement channel circuit and configured to de-chop the digital output signal; and a first digital filter configured to receive the de-chopped digital output signal. The subject matter comprising a second output channel circuit in parallel with the first output channel circuit and coupled to the output of the measurement channel circuit, the second output channel including a second digital filter configured to receive the digital output signal, wherein during a first conversion cycle, the first digital filter is configured to determine a first output signal and the second digital filter is configured to determine a second output signal, wherein during a second conversion cycle in the presence of the stimulus applied through the shunt resistor, the first digital filter is configured to determine a third output signal and the second digital filter is configured to determine a fourth output signal, the apparatus further comprising a processor configured to determine the resistance of the shunt resistor using the first, second, third, and fourth output signals.

In Aspect 11, the subject matter of Aspect 10 can optionally include, wherein the stimulus source is a current source.

In Aspect 12, the subject matter of one or more of Aspects 10-11 can optionally include, wherein the processor is configured to determine a battery current using the first, second, third, and fourth output signals.

In Aspect 13, the subject matter of one or more of Aspects 10-12 can optionally include, wherein the applied stimulus through the shunt resistor is a first stimulus, and wherein during a first conversion cycle, the first digital filter is configured to determine a first output signal and the second digital filter is configured to determine a second output signal includes: wherein during a first conversion cycle in the presence of a second stimulus applied through the shunt resistor, the first digital filter is configured to determine a first output signal and the second digital filter is configured to determine a second output signal, wherein the first stimulus is different from the second stimulus.

In Aspect 14, the subject matter of one or more of Aspects 10-13 can optionally include, a 4-wire measurement system coupled to first and second terminals of the shunt resistor.

In Aspect 15, the subject matter of Aspect 14 can optionally include, wherein the stimulus source is configured to invert the stimulus during alternating chop phases of the second conversion cycle.

In Aspect 16, the subject matter of one or more of Aspects 10-13 can optionally include, a 3-wire measurement system coupled to first and second terminals of the shunt resistor.

In Aspect 17, the subject matter of one or more of Aspects 10-16 can optionally include, wherein at least one of the first digital filter and the second digital filter includes a sine filter.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A method of determining a resistance of a shunt resistor coupled to a battery terminal, the method comprising:

receiving an input signal corresponding to a voltage across the shunt resistor;

during a first conversion cycle in the absence of a stimulus applied to the shunt resistor and during a second conversion cycle in the presence of the stimulus applied to the shunt resistor:

generating a first digital signal using a combination of a chopped input signal and an offset error;

determining a first output signal using a de-chopped first digital signal; and determining a second output signal using the first digital signal; and determining the resistance of the shunt resistor using the first and second output signals from the first and second conversion cycles.

2. The method of claim 1, comprising:
determining a battery current using the first and second output signals.

3. The method of claim 1, wherein determining a first output signal using a de-chopped first digital signal includes:
filtering, using a first channel, the de-chopped first digital signal to determine the first output signal, and
wherein determining a second output signal using the first digital signal includes:
filtering, using a second channel, the first digital signal to determine the second output signal.

4. The method of claim 1, comprising:
applying a current having a specified value from a current source through the shunt resistor.

5. The method of claim 1, comprising:
applying a current through the shunt resistor using first and second wires of a 4-wire measurement system.

6. The method of claim 5, wherein applying a current through the shunt resistor using first and second wires of a 4-wire measurement system includes:
during alternating chop phases of the second conversion cycle, de-chopping the current.

7. The method of claim 1, comprising:
applying a current through the shunt resistor using a first wire of a 3-wire measurement system.

8. The method of claim 1, wherein the applied stimulus through the shunt resistor is a first current, the method further comprising:
before the first conversion cycle, applying a second current through the shunt resistor, wherein the first current is different from the second current.

9. The method of claim 1, comprising:
applying a current through the shunt resistor including:
during a first chop phase of the second conversion cycle, applying the current having a first polarity; and
during a second chop phase of the second conversion cycle, applying the current having a polarity opposite the first polarity.

10. An apparatus for determining a resistance of a shunt resistor coupled to a battery terminal, the apparatus comprising:
a measurement channel circuit configured to receive a chopped input signal corresponding to a voltage across the shunt resistor and to generate a first digital signal using a combination of the chopped input signal and an offset error during a first conversion cycle in the absence of a stimulus applied to the shunt resistor and during a second conversion cycle in the presence of the stimulus applied to the shunt resistor;

a first output channel circuit coupled to the output of the measurement channel circuit and configured to determine a first output signal using a de-chopped first digital signal for the first and second conversion cycles;

a second output channel circuit coupled to the output of the measurement channel circuit and configured to determine a second output signal using the first digital signal for the first and second conversion cycles; and a processor configured to determine the resistance of the shunt resistor using the first and second output signals from the first and second conversion cycles.

11. The apparatus of claim 10, wherein the stimulus applied is a current.

12. The apparatus of claim 10, wherein the processor is configured to determine a battery current using the first and second output signals.

13. The apparatus of claim 10, further comprising:
an input chopping switch network configured to receive and chop the input signal,
wherein the first output channel circuit includes an output chopping switch network coupled to an output of the measurement channel circuit and configured to de-chop the first digital signal.

14. The apparatus of claim 10, comprising:
a 4-wire measurement system coupled to first and second terminals of the shunt resistor.

15. The apparatus of claim 14, further comprising:
a stimulus source to supply the applied stimulus, wherein the stimulus source is configured to invert the stimulus during alternating chop phases of the second conversion cycle.

16. The apparatus of claim 10, comprising:
a 3-wire measurement system coupled to first and second terminals of the shunt resistor.

17. The apparatus of claim 10, wherein the first output channel circuit includes a first digital filter, wherein the second output channel circuit includes a second digital filter, and wherein at least one of the first digital filter and the second digital filter includes a sinc filter.

18. An apparatus for determining a resistance of a shunt resistor coupled to a battery terminal, the apparatus comprising:
means for receiving an input signal corresponding to a voltage across the shunt resistor;
means for generating a first digital signal using a combination of a chopped input signal and an offset error during a first conversion cycle in the absence of a stimulus applied to the shunt resistor and during a second conversion cycle in the presence of the stimulus applied to the shunt resistor;
means for determining a first output signal using a de-chopped first digital signal for the first and second conversion cycles; and
means for determining a second output signal using the first digital signal for the first and second conversion cycles; and
means for determining the resistance of the shunt resistor using the first and second output signals.

19. The apparatus of claim 18, comprising:
means for determining a battery current using the first and second output signals.

20. The apparatus of claim 18, comprising:
means for applying a current having a known value from a current source through the shunt resistor.

* * * * *